(12) United States Patent
Micheloni et al.

(10) Patent No.: US 9,590,656 B2
(45) Date of Patent: Mar. 7, 2017

(54) SYSTEM AND METHOD FOR HIGHER QUALITY LOG LIKELIHOOD RATIOS IN LDPC DECODING

(71) Applicant: Microsemi Storage Solutions (US), Inc., Aliso Viejo, CA (US)

(72) Inventors: Rino Micheloni, Turate (IT); Alessia Marelli, Dalmine (IT); Peter Z. Onufryk, Flanders, NJ (US); Christopher I. W. Norrie, San Jose, CA (US); Ihab Jaser, San Jose, CA (US); Luca Crippa, Busnago (IT)

(73) Assignee: Microsemi Storage Solutions (US), Inc., Aliso Viejo, CA (US)

( * ) Notice: Subject to any disclaimer, the term of this patent is extended or adjusted under 35 U.S.C. 154(b) by 54 days.

(21) Appl. No.: 14/210,067

(22) Filed: Mar. 13, 2014

(65) Prior Publication Data

US 2014/0281800 A1    Sep. 18, 2014

Related U.S. Application Data

(60) Provisional application No. 61/793,198, filed on Mar. 15, 2013.

(51) Int. Cl.
| | |
|---|---|
| *H03M 13/00* | (2006.01) |
| *H03M 13/11* | (2006.01) |
| *H03M 13/39* | (2006.01) |
| *H03M 13/25* | (2006.01) |
| *H04L 1/00* | (2006.01) |
| *H03M 13/15* | (2006.01) |

(Continued)

(52) U.S. Cl.
CPC ...... *H03M 13/1111* (2013.01); *G06F 11/1012* (2013.01); *H03M 13/255* (2013.01); *H03M 13/3927* (2013.01); *G06F 11/10* (2013.01); *H03M 13/15* (2013.01); *H03M 13/3723* (2013.01); *H04L 1/0057* (2013.01)

(58) Field of Classification Search
CPC .... H03M 13/15; H03M 13/151; H03M 13/19; H03M 13/3927; H03M 13/1162; H03M 13/1177; H03M 13/255; H04L 1/0057; G06F 11/10
USPC .......................... 714/773, 752, 759, 780, 721
See application file for complete search history.

(56) References Cited

U.S. PATENT DOCUMENTS

| | | |
|---|---|---|
| 5,615,235 A | 3/1997 | Kakuishi et al. |
| 5,732,092 A | 3/1998 | Shinohara |

(Continued)

*Primary Examiner* — Esaw Abraham
*Assistant Examiner* — Osman M Alshack
(74) *Attorney, Agent, or Firm* — Glass & Associates; Kenneth Glass; Molly Sauter

(57) ABSTRACT

A nonvolatile memory storage controller is provided for delivering log likelihood ratios (LLRs) to a low-density parity check (LDPC) decoder for use in the decoding of an LDPC encoded codeword. The controller includes read circuitry for reading an LDPC encoded codeword stored in a nonvolatile memory storage module using a plurality of soft-decision reference voltages to provide a plurality of soft-decision bits representative of the codeword. The controller further includes a plurality of neighboring cell contribution LLR look-up tables representative of the contribution of the neighboring cells to threshold voltage distribution of the memory storage module. The controller provides the LLRs from the appropriate LLR look-up table to an LDPC decoder for the subsequent decoding of the codeword.

18 Claims, 16 Drawing Sheets

(51) Int. Cl.
*G06F 11/10* (2006.01)
*H03M 13/37* (2006.01)

(56) References Cited

U.S. PATENT DOCUMENTS

| | | |
|---|---|---|
| 6,115,788 A | 9/2000 | Thowe |
| 6,539,515 B1 | 3/2003 | Gong |
| 6,633,856 B2 | 10/2003 | Richardson et al. |
| 6,725,409 B1 | 4/2004 | Wolf |
| 6,789,227 B2 | 9/2004 | De Souza et al. |
| 6,895,547 B2 | 5/2005 | Eleftheriou et al. |
| 6,934,804 B2 | 8/2005 | Hashemi |
| 6,976,194 B2 | 12/2005 | Cypher |
| 6,976,197 B2 | 12/2005 | Faust et al. |
| 7,116,732 B2 | 10/2006 | Worm et al. |
| 7,206,992 B2 | 4/2007 | Xin |
| 7,209,527 B2 | 4/2007 | Smith et al. |
| 7,237,183 B2 | 6/2007 | Xin |
| 7,324,559 B2 | 1/2008 | McGibney |
| 7,450,668 B2 | 11/2008 | Ghosh et al. |
| 7,457,906 B2 | 11/2008 | Pettey et al. |
| 7,472,331 B2 | 12/2008 | Kim et al. |
| 7,484,158 B2 | 1/2009 | Sharon et al. |
| 7,529,215 B2 | 5/2009 | Osterling |
| 7,567,472 B2 | 7/2009 | Gatzemeier et al. |
| 7,694,047 B1 | 4/2010 | Alston |
| 7,739,472 B2 | 6/2010 | Guterman et al. |
| 7,752,346 B2 | 7/2010 | Talayco et al. |
| 7,801,233 B1 | 9/2010 | Chow et al. |
| 7,904,793 B2 | 3/2011 | Mokhlesi et al. |
| 7,937,641 B2 | 5/2011 | Amidi |
| 7,945,721 B1 | 5/2011 | Johnsen et al. |
| 7,958,430 B1 | 6/2011 | Kolokowsky et al. |
| 7,975,193 B2 | 7/2011 | Johnson |
| 8,094,508 B2 | 1/2012 | Gatzemeier et al. |
| 8,140,930 B1 | 3/2012 | Mauro |
| 8,176,367 B2 | 5/2012 | Dreifus et al. |
| 8,219,894 B2 | 7/2012 | Au et al. |
| 8,223,745 B2 | 7/2012 | Johnsen et al. |
| 8,228,728 B1 * | 7/2012 | Yang .................. G11C 11/5628 365/185.03 |
| 8,245,112 B2 | 8/2012 | Hicken et al. |
| 8,245,117 B1 | 8/2012 | Wu |
| 8,250,286 B2 | 8/2012 | Yeh et al. |
| 8,254,112 B2 | 8/2012 | Yang et al. |
| 8,255,770 B2 | 8/2012 | Park et al. |
| 8,259,498 B2 | 9/2012 | Yogev et al. |
| 8,261,136 B2 | 9/2012 | D'abreu et al. |
| 8,281,227 B2 | 10/2012 | Thatcher et al. |
| 8,286,004 B2 | 10/2012 | Williams |
| 8,307,258 B2 | 11/2012 | Flynn et al. |
| 8,327,220 B2 | 12/2012 | Borchers et al. |
| 8,335,977 B2 | 12/2012 | Weingarten et al. |
| 8,341,502 B2 | 12/2012 | Steiner et al. |
| 8,359,522 B2 | 1/2013 | Gunnam et al. |
| 8,392,789 B2 | 3/2013 | Biscondi et al. |
| 8,402,201 B2 | 3/2013 | Flynn et al. |
| 8,418,023 B2 | 4/2013 | Gunnam et al. |
| 8,429,325 B1 | 4/2013 | Onufryk et al. |
| 8,429,497 B2 | 4/2013 | Tu et al. |
| 8,493,791 B2 | 7/2013 | Karakulak et al. |
| 8,504,885 B2 | 8/2013 | Haratsch et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,640,005 B2 | 1/2014 | Wilkerson et al. |
| 8,645,613 B2 | 2/2014 | Tan et al. |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,739,008 B2 | 5/2014 | Liu et al. |
| 8,775,913 B2 | 7/2014 | Haratsch et al. |
| 8,898,372 B2 | 11/2014 | Yeh |
| 8,917,734 B1 | 12/2014 | Brown |
| 8,924,824 B1 | 12/2014 | Lu |
| 8,958,247 B2 | 2/2015 | Asaoka et al. |
| 8,995,302 B1 | 3/2015 | Brown et al. |
| 9,025,495 B1 | 5/2015 | Onufryk et al. |
| 9,058,289 B2 | 6/2015 | Tai et al. |
| 9,294,132 B1 | 3/2016 | Peleato-Inarrea |
| 2002/0051501 A1 | 5/2002 | Demjanenko et al. |
| 2002/0181438 A1 | 12/2002 | McGibney |
| 2003/0033567 A1 | 2/2003 | Tamura et al. |
| 2003/0104788 A1 | 6/2003 | Kim |
| 2003/0225970 A1 | 12/2003 | Hashemi |
| 2004/0088636 A1 | 5/2004 | Cypher |
| 2004/0123230 A1 | 6/2004 | Lee et al. |
| 2004/0234150 A1 | 11/2004 | Chang |
| 2004/0252791 A1 | 12/2004 | Shen et al. |
| 2004/0268015 A1 | 12/2004 | Pettey et al. |
| 2005/0010846 A1 | 1/2005 | Kikuchi et al. |
| 2005/0226355 A1 | 10/2005 | Kibune et al. |
| 2005/0248999 A1 | 11/2005 | Tamura et al. |
| 2005/0286511 A1 | 12/2005 | Johnsen et al. |
| 2006/0039370 A1 | 2/2006 | Rosen et al. |
| 2006/0126728 A1 | 6/2006 | Yu et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0136628 A1 | 6/2007 | Doi et al. |
| 2007/0147489 A1 | 6/2007 | Sun et al. |
| 2007/0233939 A1 | 10/2007 | Kim |
| 2008/0005382 A1 | 1/2008 | Mimatsu |
| 2008/0016425 A1 | 1/2008 | Khan et al. |
| 2008/0229079 A1 | 9/2008 | Flynn et al. |
| 2008/0229164 A1 | 9/2008 | Tamura et al. |
| 2008/0256292 A1 | 10/2008 | Flynn et al. |
| 2008/0267081 A1 | 10/2008 | Roeck |
| 2008/0276156 A1 | 11/2008 | Gunnam et al. |
| 2009/0067320 A1 | 3/2009 | Rosenberg et al. |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 * | 12/2009 | Roohparvar ........ G11C 11/5628 365/185.02 |
| 2009/0327802 A1 | 12/2009 | Fukutomi |
| 2010/0085076 A1 * | 4/2010 | Danilin ............ H03K 19/17736 326/38 |
| 2010/0162075 A1 | 6/2010 | Brannstrom et al. |
| 2010/0199149 A1 | 8/2010 | Weingarten |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0293440 A1 | 11/2010 | Thatcher |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0209031 A1 | 8/2011 | Kim et al. |
| 2011/0225341 A1 | 9/2011 | Satoh et al. |
| 2011/0246136 A1 * | 10/2011 | Haratsch ................ H04L 1/005 702/181 |
| 2011/0246842 A1 * | 10/2011 | Haratsch ............ G11C 16/3454 714/722 |
| 2011/0246853 A1 | 10/2011 | Kim |
| 2011/0296084 A1 | 12/2011 | Nango |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0141139 A1 | 6/2012 | Bakhru et al. |
| 2012/0166690 A1 | 6/2012 | Regula |
| 2012/0311402 A1 | 12/2012 | Tseng et al. |
| 2013/0013983 A1 | 1/2013 | Livshitz et al. |
| 2013/0086451 A1 | 4/2013 | Grube et al. |
| 2013/0117616 A1 | 5/2013 | Tai et al. |
| 2013/0117640 A1 | 5/2013 | Tai et al. |
| 2013/0145235 A1 | 6/2013 | Aussien et al. |
| 2013/0163327 A1 | 6/2013 | Karakulak et al. |
| 2013/0163328 A1 | 6/2013 | Karakulak et al. |
| 2013/0176779 A1 * | 7/2013 | Chen .................. G11C 11/5642 365/185.03 |

(56) References Cited

U.S. PATENT DOCUMENTS

| | | | |
|---|---|---|---|
| 2013/0185598 A1* | 7/2013 | Haratsch | G06F 11/1048 |
| | | | 714/42 |
| 2013/0315252 A1 | 11/2013 | Emmadi et al. | |
| 2013/0318422 A1 | 11/2013 | Weathers et al. | |
| 2014/0040704 A1* | 2/2014 | Wu | G11C 29/52 |
| | | | 714/773 |
| 2014/0053037 A1 | 2/2014 | Wang et al. | |
| 2014/0068368 A1 | 3/2014 | Zhang et al. | |
| 2014/0072056 A1 | 3/2014 | Fay | |
| 2014/0085982 A1 | 3/2014 | Asaoka et al. | |
| 2014/0101510 A1 | 4/2014 | Wang et al. | |
| 2014/0181617 A1 | 6/2014 | Wu et al. | |
| 2014/0185611 A1 | 7/2014 | Lie et al. | |
| 2014/0198581 A1 | 7/2014 | Kim et al. | |
| 2014/0281767 A1 | 9/2014 | Alhussien et al. | |
| 2014/0281822 A1* | 9/2014 | Wu | G06F 11/1068 |
| | | | 714/773 |
| 2014/0281823 A1 | 9/2014 | Micheloni et al. | |
| 2015/0149871 A1 | 5/2015 | Chen et al. | |
| 2015/0186055 A1 | 7/2015 | Darragh | |

* cited by examiner

SYSTEM AND METHOD FOR HIGHER QUALITY LOG LIKELIHOOD RATIOS IN LDPC DECODING

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. One commonly employed error correction code employed in nonvolatile memory storage modules, such as SSDs, are low-density parity-check (LDPC) codes. An LDPC code is a linear error correcting code having a parity check matrix with a small number of nonzero elements in each row and column. Various methods for decoding data encoded with LDPC error correction codes are known in the art. One commonly employed decoding method for LDPC coding is the layered min-sum algorithm (MSA). While the min-sum algorithm is an approximation of the quasi-optimal decoding method of belief propagation, the layered min-sum algorithm introduces a further hardware simplification. The layered min-sum algorithm is iterative by layer and is based on belief propagation. The layered min-sum algorithm (MSA) is less complex than other decoding methods known in the art. However, the min-sum algorithm exhibits a noticeable degradation in the decoding performance compared to the more complex decoding methods, such as belief propagation. To counteract the degradation in the decoding performance achievable with the layered min-sum algorithm, normalized layered min-sum algorithms with have been developed incorporating a normalization factor, or attenuation factor, to account for the degradation in decoding performance.

The power of LDPC codes resides in the ability of the decoding strategy to exploit the soft information on the stored data. In LDPC decoding, the two voltage distributions represent the two possible states: "0" and "1", of the cells within the NAND chips. Soft information for the stored data is expressed by a log likelihood ratio (LLR). The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. The sign of the LLR typically provides the bit estimation (i.e. positive LLR corresponds to 0 and negative LLR corresponds to 1). The magnitude of the LLR provides the reliability of the estimation (i.e. $|LLR|=0$ means that the estimation is completely unreliable and $|LLR|=\infty$ means that the estimation is completely reliable and the bit value is known.

Reading soft information from the NAND chips requires multiple reads at varying reference voltages. Performing multiple reads is time consuming and has a severe negative impact on the performance of the flash memory controller. As such, it is desirable to reduce the number of reads required to obtain quality LLR data that will be useful in the decoding process.

Accordingly, what is needed in the art is an improved system and method for higher quality log likelihood ratio (LLRs) to be used in the decoding of LDPC encoded.

SUMMARY

In various embodiments, a nonvolatile memory system includes a nonvolatile memory storage module for storing encoded data. The encoded data stored in the nonvolatile memory storage module is encoded using a low-density parity check (LDPC) error correction code. A decoder receives the LDPC encoded data stored in the nonvolatile memory storage module and attempts to decode and recover the data.

A nonvolatile memory storage controller is provided for delivering log likelihood ratios (LLRs) to a low-density parity check (LDPC) decoder for use in the decoding of an LDPC encoded codeword.

In the present invention, a nonvolatile memory controller is described for providing one or more log likelihood ratios (LLRs) of a target cell for LDPC decoding includes, read circuitry configured for reading a threshold voltage of a target cell stored in a nonvolatile memory storage module and for reading a threshold voltage of one or more neighboring cells of the target cell stored in the nonvolatile memory storage module. The controller further includes one or more neighboring cell contribution LLR look-up tables associated with the nonvolatile memory storage module. The controller further includes look-up circuitry configured for extracting an LLR associated with the threshold voltage of the target cell and the threshold voltage of the one or more neighboring cells from the one or more neighboring cell contribution LLR look-up tables and for providing the extracted LLR to an LDPC decoder.

In accordance with the present invention, a method of providing one or more log likelihood ratio (LLRs) of a target cell to a low-density parity check (LDPC) decoder includes, reading a threshold voltage of a target cell stored in a nonvolatile memory storage module and reading a threshold voltage of one or more neighboring cells of the target cell stored in the nonvolatile memory storage module. After the threshold voltage of the target cell and the threshold voltage of the one or more neighboring cells of the target cell have been read, the method continues by accessing a neighboring cell contribution LLR look-up table associated with the nonvolatile memory storage module and extracting an LLR associated with the threshold voltage of the target cell and the threshold voltage of the one or more neighboring cells from the neighboring cell contribution LLR look-up table. The extracted LLR is then provided to an LDPC decoder for decoding of the encoded codeword.

The present invention utilizes the knowledge of now the NAND cells are physically laid out and their program/erase and read cycles to predict the most likely correct state of a cell whose correct state has been corrupted with noise. With the information regarding the programmed states of the neighboring cells, the physical proximity of the neighboring cells and the number of read and program/erase cycles that have been performed on a cell being read, it can be determined how the current state of a neighboring cell influences the state of the cell. If these factors have a very small effect, the LLR value assigned to the cell being read would be a large magnitude. If these factors have a larger effect, the assigned LLR value would have a smaller magnitude, thereby indicating a decreased likelihood that the correct state of the cell is the value that was read. So, by reading the state of some or all of the neighboring cells, in addition to reading the desired cell, a higher quality LLR can be assigned to the cell being read, thereby improving the decoding performance resulting in a faster convergence or enabling a previously unavailable solution. The higher quality LLR values of the present invention increase the likelihood of determining a correct codeword during the decode process.

The present invention provides an improved system and method for higher quality log likelihood ratio (LLRs) to be used in the decoding of LDPC encoded.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In the operation of a stored channel utilizing LDPC encoding, original data is stored in a nonvolatile memory system. Different noise sources, estimated as a White Gaussian Noise (AWGN) Channel, corrupt the original stored message resulting in a one becoming a zero or vice versa. To improve the bit error rate, BER, the SSD write controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

Figure 1:
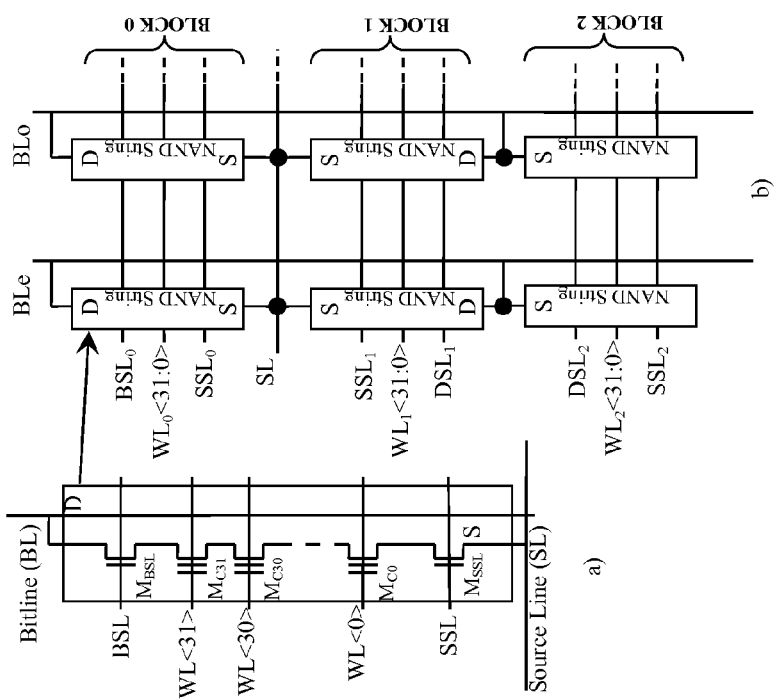
FIG. 1 is circuit diagram illustrating a NAND string and a NAND array architecture.

The nonvolatile memory system may be a NAND-based flash memory system. NAND flash memories are nonvolatile, and as such, are able to store and keep data even in the absence of a power source. With reference to FIG. 1, the basic elements of a flash memory are the nonvolatile memory cells, which are usually connected in series to form a string. Typically a string is composed of 32 or 64 cells in series. FIG. 1(*a*) illustrates the case wherein 32 cells ($M_{C0}$ to $MC_{31}$) are connected in series. Two selection transistors are placed at the edge of the string of cells. Selection transistor $M_{SSL}$ ensures the connection to the source line, while selection transistor $M_{BSL}$ connects the string to the bitline (BL). The control gates of the cells are connected through the wordlines (WLs). FIG. 1(*b*) illustrates how the matrix array of cells is built, beginning with a string. In the WL direction, adjacent NAND strings share the same WL, DSL, BSL and SL. In the BL direction, two consecutive strings share the BL contact.

In NAND based memories, a flash block is composed of the NAND strings that share the same group of WLs. FIG. 1(*b*) illustrates three blocks: BLOCK0 is made up of $WL_0<31:0>$, BLOCK1 is made up of $WL_1<31:0>$ and BLOCK2 is made up of $WL_2<31:0>$.

In NAND based memories, a logical page is composed of cells belonging to the same WL. The number of pages per WL is related to the storage capability of the memory cell. Depending upon the number of storage levels, flash memories are referred to in different ways: SLC (single level cell) memories store 1 bit per cell, MLC (multi-level cell) memories store 2 bits per cell, 8LC (eight level cell or triple level cell) memories store 3 bits per cell and 16LC (sixteen level cell) memories store 4 bits per cell.

Considering the SLC case with interleaved architecture, wherein one page is composed of even cells and a second page is composed of odd cells, as shown in FIG. 1(*b*), if the page size is 4 kB, it follows that a WL has 32,768+32, 768=65,536 cells. In contrast, in the MLC case, there are four pages, as each cell stores one least significant bit (LSB) and one most significant bit (MSB).

In general, a logical page is the smallest addressable unit for reading from and writing to the NAND memory. The number of logical pages within a logical block is typically a multiple of 16 (e.g. 64, 128). Additionally, in a NAND based memory, a logical block is the smallest erasable unit.

Figure 2:
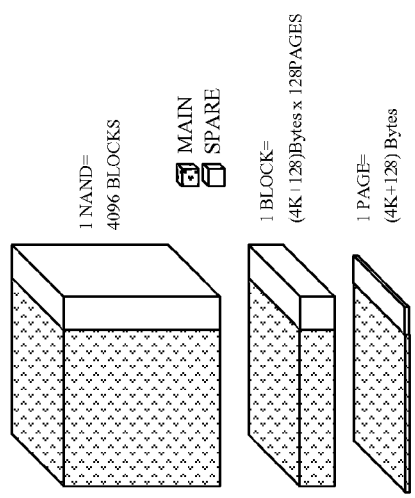
FIG. 2 is an illustration of a 16 GBit memory logic organization.

As shown with reference to FIG. 2, each page of the NAND memory is composed of a main data area and a spare area. The main area may have the size of 4 kB, 8 kB or 16 kB. The spare area can be used to store error correction codes (ECC) and is made up of hundreds of bytes for every 4 kB of main data area.

FIG. 2 illustrates the logical organization of an SLC device with a string of 64 cells, interleaving architecture and 4 kB page (plus 128 B of spare area per page). Each logical block contains 128 pages with a total of 512 kB per block. It follows that for a 4 GB (16 Gbit) memory, 4096 block are needed for storage.

While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column.

Figure 3:
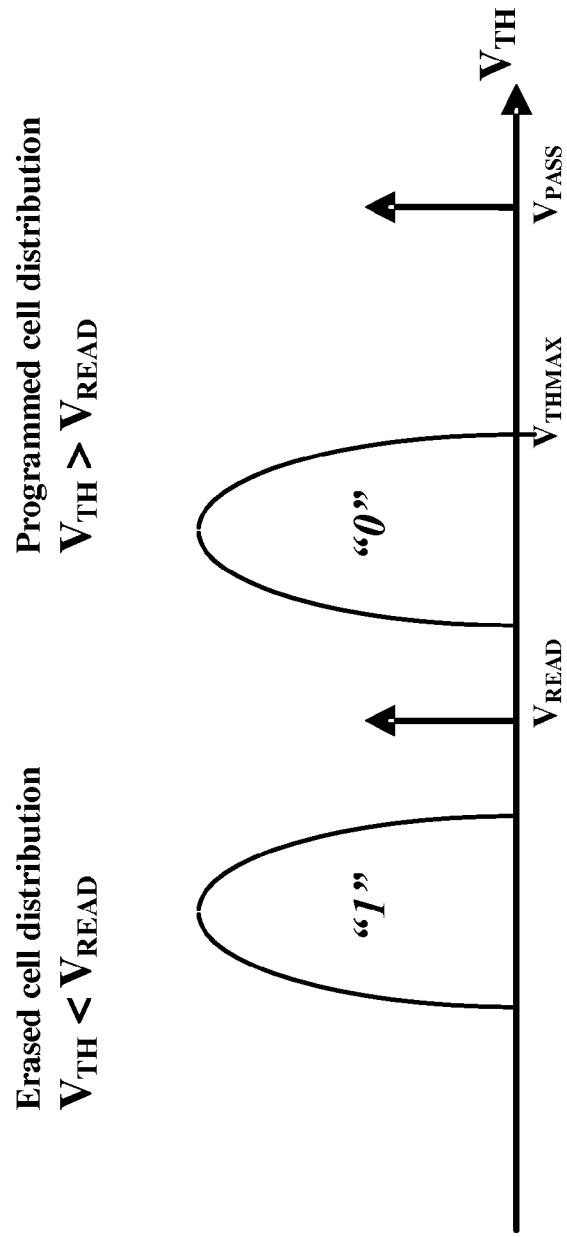
FIG. 3 is a graphical illustration of a single level cell distribution in a NAND cell.

FIG. 3 illustrates an ideal distribution level for an SLC device, wherein $V_{READ}$ is the voltage level used during the read operation of the device. As shown, if the cell has a threshold voltage of less than $V_{READ}$ it is a "1" and if the cell has a threshold voltage higher than $V_{READ}$ it is a "0". However, the ideal distribution of a SLC device is influenced by the data programmed into the adjoining cells in the device. One of the largest contributing factors affecting the distribution width is the cell-to-cell floating gate coupling.

Figure 4:
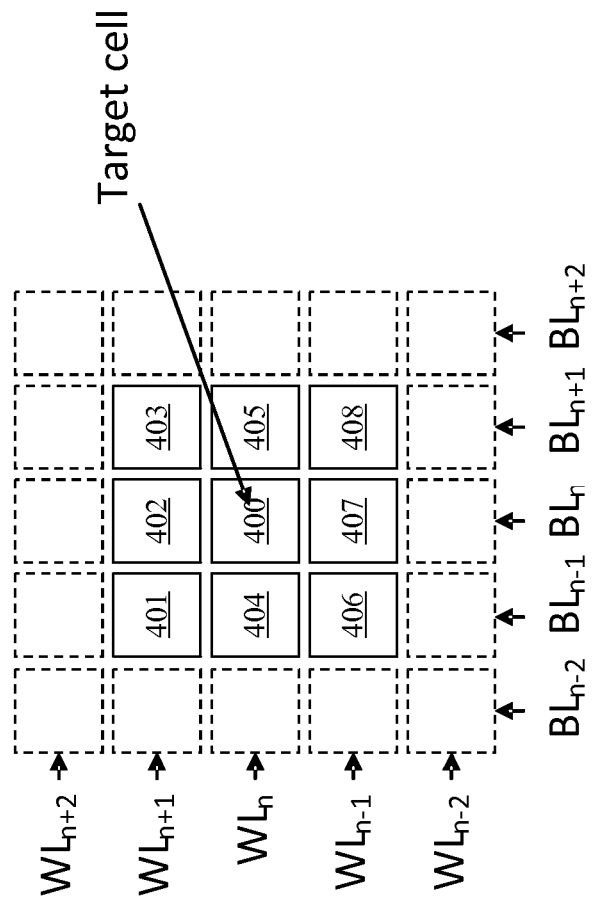
FIG. 4 is an illustration of a target cell and its surrounding cells.
Figure 5:
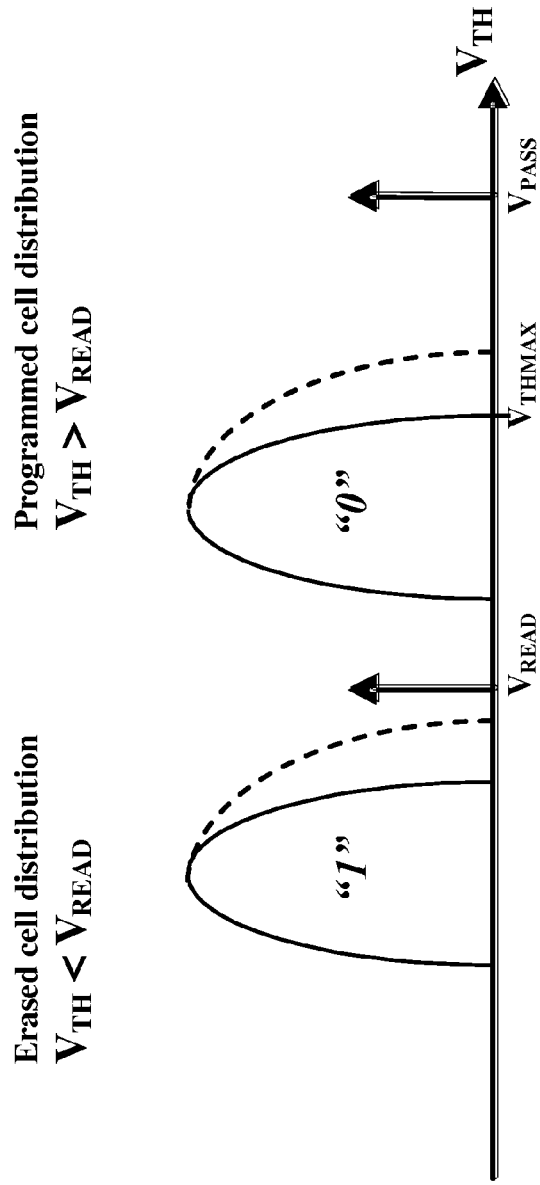
FIG. 5 is a graphical illustration of a target cell distribution after surrounding cell programming has occurred.

FIG. 4 illustrates a target cell 400 surrounded by its 8-most neighboring cells 401, 402, 403, 404, 405, 406, 407, 408. Due to the nature of the NAND architecture, coupling capacitance exists between the target cell 400 and the neighboring cells 401, 402, 403, 404, 405, 406, 407, 408. Depending upon the data to be programmed into the cell, the target cell 400 is programmed to a distribution "0" or remains in the erased state "1". Sequentially, surrounding cells (or a subset of surrounding cells) are programmed to their target distributions. Surrounding cells (or a subset of surrounding cells) move from the erased distribution to the written distribution. As a result of this, there is a change in the electric field of the target cell 400. This electric field is reflected as a voltage threshold shift for the target cell 400 that appears "more programmed". As a result, the target cell's 400 distribution experiences an enlargement on the right side of the distribution curve, as illustrated by the dotted lines in FIG. 5. As such, if a target cell, belonging to the "1" distribution, crosses the $V_{READ}$ level after the programming of the surrounding cells, it will be read in error as a "0".

Figure 6:
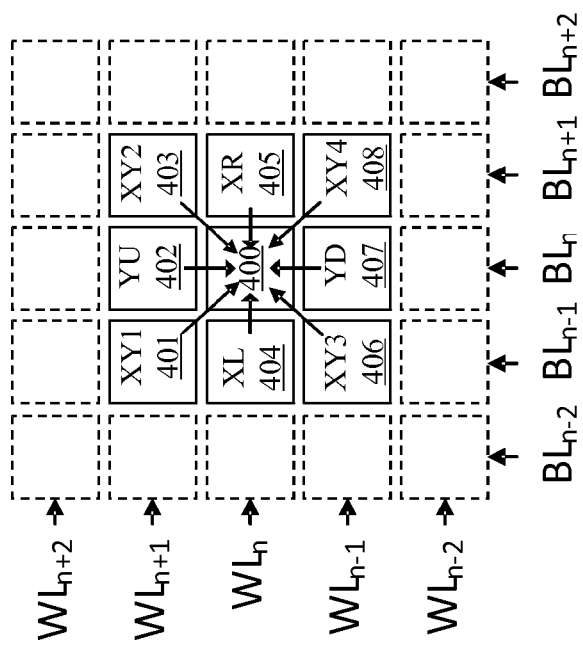
FIG. 6 is an illustration of the coupling coefficients of neighboring cells to a target cell in accordance with an embodiment of the present invention.

Each of the cells 401, 402, 403, 404, 405, 406, 407, 408 surrounding the target cell 400 contributes to the distribution of the target cell 400, depending upon the capacitive coupling ratio between the target cell 400 and the neighboring cells 401, 402, 403, 404, 405, 406, 407, 408. For each neighboring cell 401, 402, 403, 404, 405, 406, 407, 408 the effect on the distribution is dependent upon the coupling coefficients between the target cell 400 and the neighbor cell 401, 402, 403, 404, 405, 406, 407, 408 and the distribution voltage shift during program operation of the neighbor cell 401, 402, 403, 404, 405, 406, 407, 408. FIG. 6 illustrates the coupling coefficient of the eight neighboring cells 401, 402, 403, 404, 405, 406, 407, 408 affecting the target cell 400.

Typically, cells in a page are sequentially programmed from the bottom to the top ($WL_{n-2}$ to $WL_{n+2}$). In this way, background pattern dependency is minimized. Additionally, cell-to-cell coupling effects are mitigated for the target cell 400, because lower cells (pages) are programmed before the target cells 400. However, this order of programming is true only if the target cell 400 is reprogrammed (or programmed) to "0". Alternatively, if the target cell 400 stays in the erased state, it will be affected by the lowest cells as well as the highest cells, because it is not possible to lower the threshold voltage during program operation. Only the erase operation of the cells can lower the threshold voltage. As such, for an erased cell, the effect of all the surrounding cells must be considered.

The coupling coefficients of the cells do not all have the same values/weights. Experimental results show that Y coefficients 402, 407 are dominant, followed by X 404, 405 then XY 401, 403, 406, 408. Bit errors introduced by the coupling coefficients (and other phenomena) can be corrected using an ECC, such as LDPC encoding.

LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired. Well-designed LDPC codes have an UBER very near the Shannon limit.

Figure 7:
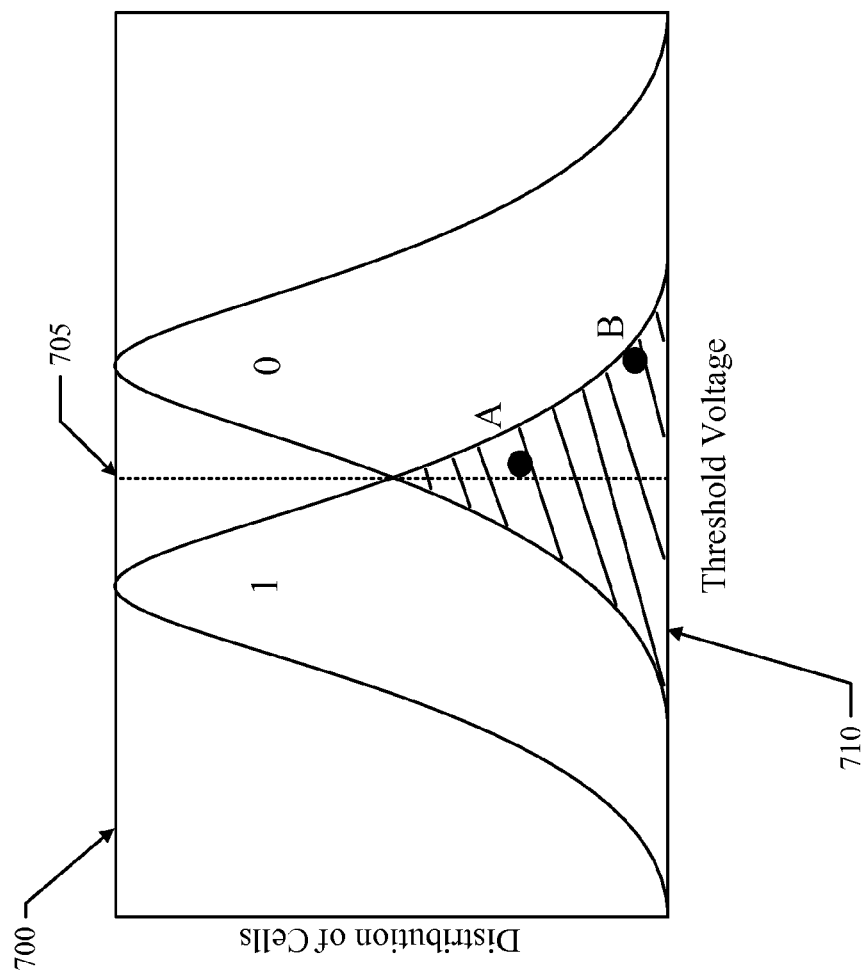
FIG. 7 is a graphical illustration of the distribution overlap in the two voltage distributions used for decoding.

The power of LDPC codes resides in the ability of the decoding strategy to exploit the soft information on the stored data. In LDPC decoding, the two voltage distributions represent the two possible states: "0" and "1", of the cells within the NAND chips. When the voltage distributions overlap 710, as shown with reference to the graph 700 of FIG. 7, errors arise. A hard decision decoder will read all the positive values as 0 and all the negative values as 1. So, in the situation depicted in the graph 700, the overlap region 710 will be composed of read errors. However, observing error points A and B within the overlap region 710, it is clear that the error points may vary in magnitude. For example, point A is slightly positive, while point B is farther away from the threshold voltage 705. As such, point A is more likely to be in error than point B. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed by a log likelihood ratio (LLR). The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. The sign of the LLR typically provides the bit estimation (i.e. positive LLR corresponds to 0 and negative LLR corresponds to 1). The magnitude of the LLR provides the reliability of the estimation (i.e. $|LLR|=0$ means that the estimation is completely unreliable and $|LLR|=\infty$ means that the estimation is completely reliable and the bit value is known. In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"'s and "1"'s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

To perform a successful read operation on the NAND-based flash memory device employing LDPC encoding, a plurality of read operations are performed at various read reference voltage levels, by applying the read reference voltage to the corresponding control gate of the cell to see if the sensed cell conducts at that particular read reference voltage. The responses of the cell for each of the read reference voltages are then used to determine the value of the bit stored by the cell. The conventional design practice is to employ uniform distribution for sensing the cells, wherein the soft-decision reference voltages are uniformly distributed between two consecutive hard-decision reference voltages. However, since the area where most errors will occur is in the overlap of the threshold voltage distributions, and since most of the overlap between two adjacent states occurs in the vicinity of the corresponding hard-decision reference voltages, the present invention employs non-uniform partitioning of the threshold voltage distribution to improve the quality of the soft information. As such, by concentrating the soft-decision reference voltages around the hard-decision reference voltages and within the overlap regions, the same number of sensing voltages can be used in a non-uniform way to provide better information for determining the bit value.

Figure 8:
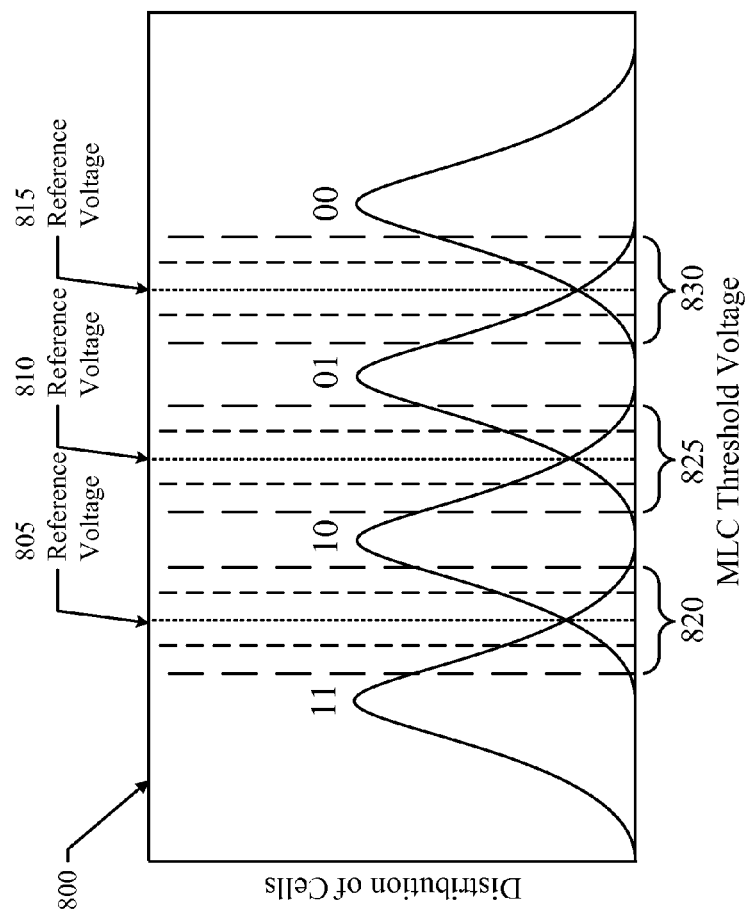
FIG. 8 is a graphical illustration of is a graphical illustration of a possible threshold voltage distribution for a multi-level cell and the corresponding read reference voltages.

As shown with reference to FIG. 8, in accordance with an embodiment of the present invention, non-uniform threshold voltage sensing is performed for an MLC cell, wherein the overlap regions 820, 825 and 830 are defined around each of the hard-decision reference voltages 805, 810 and 815 and uniform memory sensing is performed within each of the overlap regions using the plurality of soft-decision reference voltages. In the case of an MLC flash memory, the overlap regions of the threshold voltage distributions for the flash memory cells are divided into a number of partitions, on either side of the hard-decision reference voltage, by moving the read reference voltages. In order to locate each bit without error, more read operations at these soft-decision reference voltages are required. As shown in the graph 800 of FIG. 8, in a specific embodiment, each overlap region 820, 825 and 830 is divided into four partitions, so that each bit (LSB and MSB) is read utilizing 3 bits, where 3 represents the number of soft-decision bits.

As previously described, for LDPC decoding, the log likelihood ratio (LLR) of the received data bits in the codeword is used to decode the codeword. As such, after each bit position is measured and the 3-bit soft-decision data has been identified, the proper LLR associated with the soft-decision bits is extracted from a look-up table stored in the flash controller and the LLR is then fed to the LDPC decoder for subsequent decoding of the codeword. In the exemplary embodiment shown in FIG. 8, 3 soft-decision bits are used to identify eight regions, therefore eight LLRs will be extracted from the look-up table to perform the LDPC decoding process. Additionally, every overlap region requires an LLR look-up table, so that in the MLC case illustrated in FIG. 8, three LLR look-up tables are needed to provide the necessary decoding information.

In an alternative embodiment, a single soft-decision reference voltage may be used instead of a plurality of soft-decision references voltages, resulting in only two soft-decision bits. In this embodiment, the soft-decision decoding may be considered hard-decision decoding resulting in a two-state result and therefore, two corresponding LLRs. As with the soft-decision LLRs, these hard-decision LLRs will also change over the lifetime of the device.

As previously described, due to neighboring cells and the program/erase wear-out of the flash memory, the bit error rate (BER) of the memory device increases during its lifetime. It follows that the log likelihood ratios (LLRs) of the flash memory device also change over the lifetime of the device, as the LLR values are measures of the reliability of the data read from the memory storage. However, LDPC decoders currently known in the art do not consider the changes in the LLRs associated with the flash memory during the lifetime of the device and the effects of the neighboring cells on a target cell of the device. Instead, prior art LDPC decoders are designed for a maximum bit error rate that does not change during the memory device lifetime and does not consider the effects of neighboring cells.

LLRs are a function of the shape and location of the threshold voltage distribution for the flash cells and can be computed or measured in a characterization laboratory. In order to provide the LDPC decoder with the correct soft-decision information, the LLR look-up tables used for decoding must represent the channel and the BER at that specific point in the lifetime of the flash memory. The threshold voltage distribution for the flash cells changes over the lifetime of the device due to wear-out and as such, the LLRs also change. As such, in order to provide the correct soft-decision information over the lifetime of the flash memory, a plurality of LLR tables are needed that accurately reflect the threshold voltage distributions at various points over the lifetime of the device. For example, a first LLR look-up table would be used for a fresh device, having a BER of around $10^{-6}$ and a second LLR look-up table would be used for the device towards the end of the device lifetime, when the BER is around $10^{-2}$. By utilizing LLR look-up tables that are reflective of the current point in the lifetime of the device, the LLR look-up table will most accurately represent the noise and the LDPC will perform in a quasi-optimal way.

Each flash technology exhibits a unique threshold voltage distribution over its lifetime. As such, a generic law does not exist for determining standard LLR look-up table values for the variety of flash devices available in the market. Instead, in order to characterize the flash device and thereby determine the appropriate lifetime LLR look-up table values, it is necessary to measure billions and billions of flash cell distributions over the lifetime of each flash device to understand how the flash cells will perform. The lifetime threshold voltage distribution will differ among technologies and among vendors. For example, it may be determined that a different LLR look-up table for every decade of BER accurately reflects the behavior of the flash cells over the lifetime of the device. As such, when the BER of the flash device changes from $10^{-4}$ to $10^{-5}$, a different LLR look-up table will be accessed in the flash controller to reflect this characterized change in BER. Additionally, at any single point in time, there may be multiple flash chips of the flash device operating at different points in their lifetime, or perhaps a single flash chip comprising regions that are operating at different points in their lifetime. By performing characterization of the flash device, either by computational techniques and laboratory measurements, a plurality of lifetime LLR look-up tables can be generated for the flash device that accurately reflect the change in the threshold voltage distribution of the flash device over its lifetime. The LLR look-up tables may also reflect changes to specific flash chips of the flash device or specific regions of a flash chip over the lifetime of the device. The plurality of LLR look-up tables are stored in the flash memory controller and in operation, the flash memory controller selects the appropriate LLR look-up table to use for decoding the codeword based upon the present point in the lifetime of the device.

Additionally, in order to provide a higher quality LLR for a target cell, the effect of the programmed states of the neighboring cells on the threshold voltage of the target cell need to be considered.

In the present invention to address the contribution of the programmed state of the neighboring cells to the threshold voltage of a target cell, a neighboring cell contribution LLR look-up table is populated that is representative of the BER of a target cell (bit error probability) for each combination of possible patterns of the surrounding cells. With reference to FIG. 6, for each target cell 400, $2^9=512$ combinations of 0/1 are possible in considering all of the 9 cells 401, 402, 403, 404, 405, 406, 407 and 408 surrounding the target cell 400.

Figure 9:
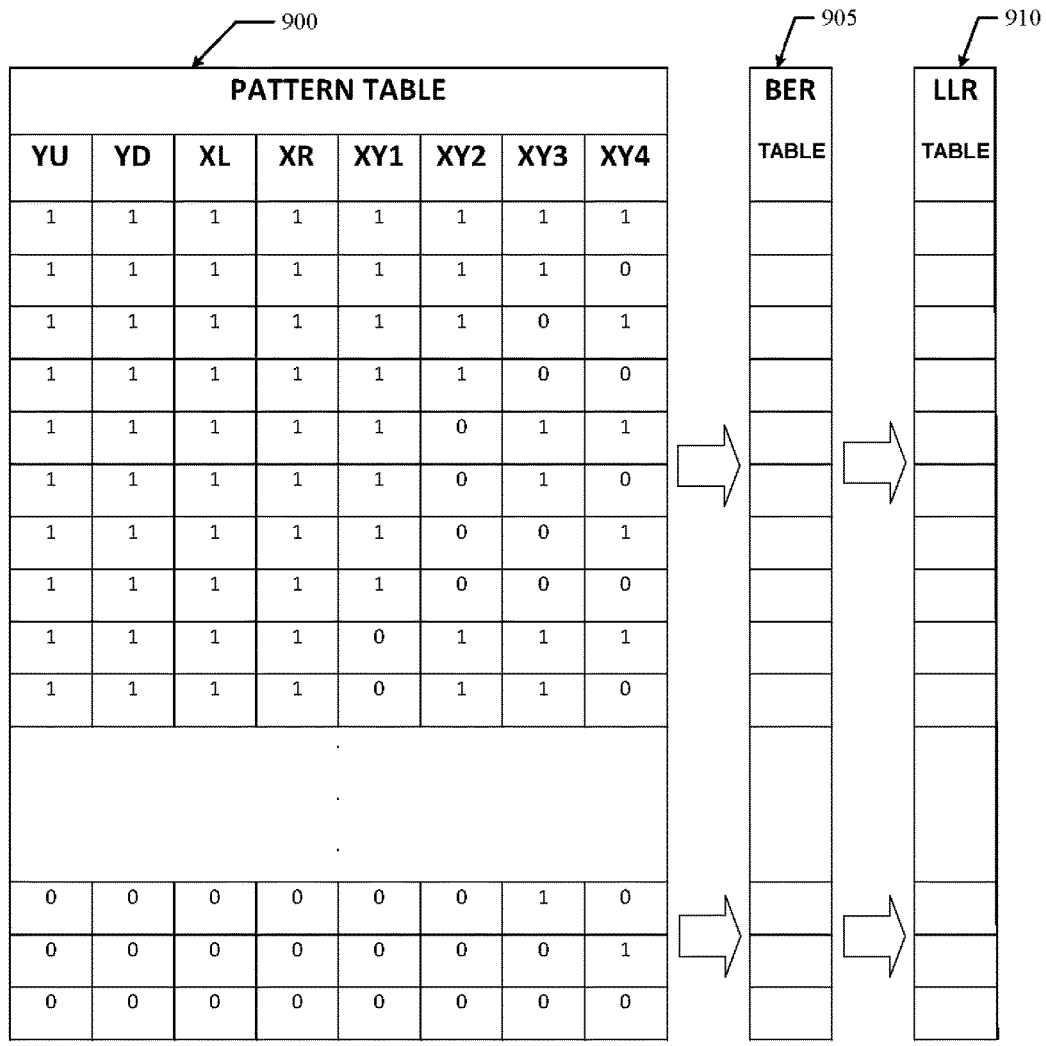
FIG. 9 is an illustration of a pattern table, BER table and LLR table in accordance with an embodiment of the present invention.
Figure 10:
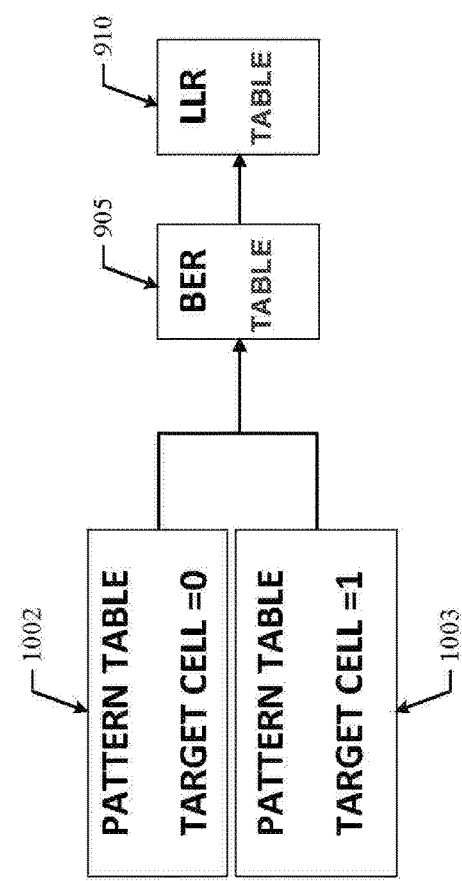
FIG. 10 is an illustration of a pattern table, BER table and LLR table in accordance with an embodiment of the present invention.

FIG. 9 illustrates a pattern table 900 for the neighboring cells 401, 402, 403, 404, 405, 406, 407 and 408 surrounding the target cell 400, a BER table 905 for the target cell 400 and a resulting neighboring cell contribution LLR look-up table 910 populated by the BER table and the pattern table. In accordance with the present invention, the pattern table 900 in FIG. 9 includes all of the $2^8=256$ pattern combinations for the 8 surrounding cells 401, 402, 403, 404, 405, 406, 407 and 408. Additionally, there is one pattern table 1003 for the case in which the target cell 400 is programmed to "1" and another pattern table 1002 for the case in which the target cell 400 is programmed to "0", as shown with reference to FIG. 10. The BER table 905 is then populated as a function of the pattern 0/1 in the surrounding cell as:

BER=f(yu, yd, xl, xr, xy1, xy2, xy3, xy4)

In addition, it is possible that the values of all neighboring cells 401, 402, 403, 404, 405, 406, 407 and 408 may not need to be fully determined for the application of the invention. For example, in the case of an MLC, the two states of the MSB value may have a larger voltage difference than the two LSB states. So, the MSB bit of the neighboring cells may influence the target cell 400 the most and the LSB bit of the neighboring cells may be ignored.

Figure 11:
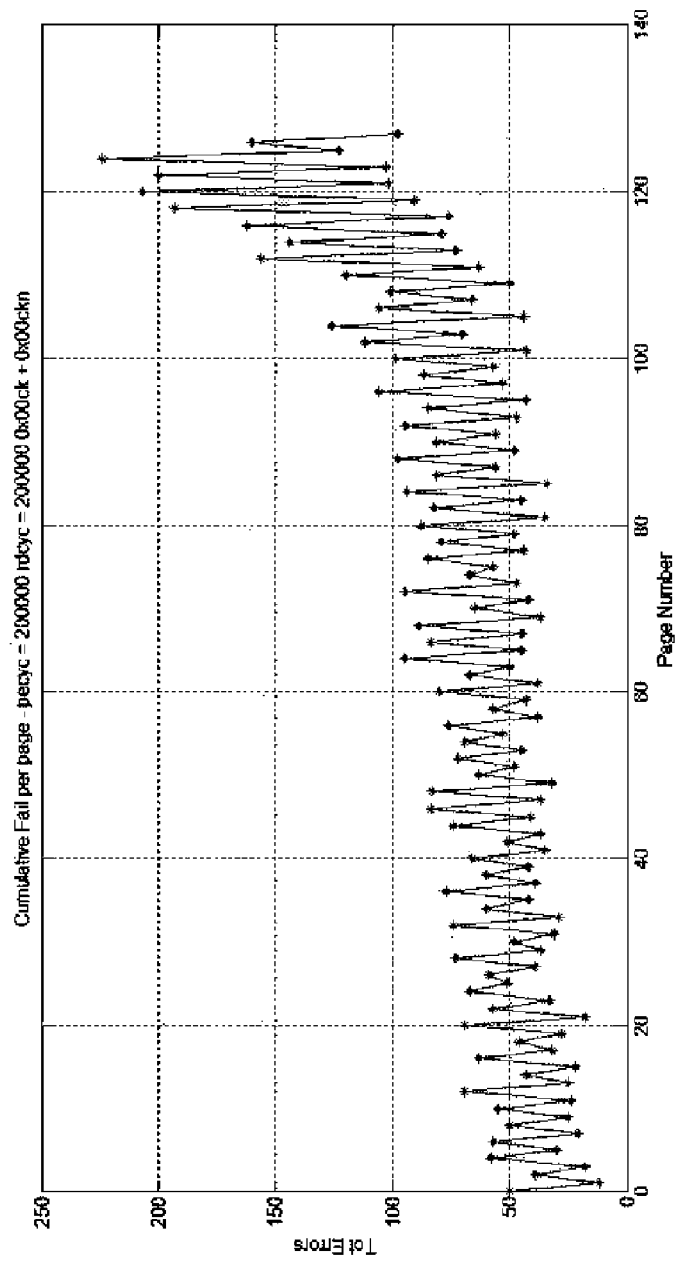
FIG. 11 is a graphical illustration of the average fail distribution inside pages of a NAND device.

Experimental results show that the BER of the target cell 400 is page dependent. As such, a BER table 905 can be populated for each page. FIG. 11 illustrates a typical fail distribution as a function of page number (x-axis). As shown, fails are not uniformly distributed among pages, but instead, the number of fails has a tendency to increase with page number. It follows that different BER tables 905 can be populated, page by page. Experimental results show that two BER tables 905 are sufficient for an interleaving architecture of the NAND device, wherein one BER table 905 is representative of the even pages and another BER table 905 is representative of the odd pages. Additionally, each intermediate combination can be included, wherein one BER table 1005 is representative of the lower pages and another BER table 905 is representative of the higher, etc. Various other configurations of the BER table 905 appropriate for the particular NAND device are within the scope of the invention.

The entries for the BER table 905 can be measured by the NAND controller is many ways. For example, BER can be measured on one, or more, dummy blocks during the device life. Since BER is dependent upon the number of P/E cycles, it must be measured for every fixed or variable step of P/E cycles. BER can also be measured on the data block, similar to the dummy block. The BER can be measured every fixed or variable step of P/E cycles after the erase cycle.

After the neighboring cell contribution LLR look-up tables have been populated and stored in the nonvolatile memory storage module, the nonvolatile memory controller of the present invention can be used to provide one or more log likelihood ratios (LLRs) of a target cell for LDPC decoding. Accessing an LLR look-up table comprising LLRs that reflect the contribution of the neighboring cells to the threshold level of the target cell being read, as taught by the present invention, may be used to improve the performance of the LDPC decoder in decoding LDPC encoded data that is stored in a nonvolatile memory system. As shown with reference to FIG. 12, a nonvolatile memory system 1200, such as a solid state drive, includes a nonvolatile memory controller 1205 coupled to a nonvolatile memory storage module 1215 comprising a plurality of NAND chips 1230. In this embodiment, the NAND chips 1230 store the encoded codewords and the memory controller 1205 is designed to execute reading and writing controls for the NAND chips 1230 according to reading and writing instructions received from an access device. The nonvolatile memory controller 1205 further includes read circuitry 1240 configured for reading a threshold voltage of a target cell stored in the nonvolatile memory storage module 1215 and for reading a threshold voltage of one or more neighboring cells of the target cell stored in the nonvolatile memory storage module 1215. The nonvolatile memory controller further includes one or more neighboring cell contribution LLR look-up tables 1235 associated with the nonvolatile memory storage module 1215. Look-up circuitry 1250 of the nonvolatile memory controller 1205 is configured for extracting an LLR associated with the threshold voltage of the target cell and the threshold voltage of the one or more neighboring cells from the one or more neighboring cell contribution LLR look-up tables 1235 and for providing the extracted LLR to an LDPC decoder.

The read circuitry 1240 is further configured for reading a logical page of the nonvolatile memory storage module 1215, where the logical page includes the target cell. The read circuitry 1240 is further configured for reading one or more neighboring logical pages of the nonvolatile memory storage 1215, each of the one or more neighboring logical pages including one of the neighboring cells of the target cell. In reading the threshold voltage of the target cell, the read circuitry 1240 may utilize a plurality of soft-decision reference voltages to read a plurality of threshold voltages of the target cell. Additionally, in reading the threshold voltages of the one or more neighboring cells, the read circuitry 1240 may utilize a plurality of soft-decision reference voltages to read a plurality of threshold voltages of each of the one or more neighboring cells.

In one embodiment, the one or more neighboring cell contribution LLR look-up tables 1235 may include a neighboring cell contribution LLR look-up table 1235 that is associated with a current point in the lifetime of the nonvolatile memory storage module 1215. As such, the BER appropriate for the age of the nonvolatile memory storage module 1215 may be taken into consideration when generating the neighboring cell contribution LLR look-up tables 1235.

In an additional embodiment, the one or more neighboring cell contribution LLR look-up tables 1235 may include a neighboring cell contribution LLR look-up table 1235 that is associated with a logical page of the nonvolatile memory storage module 1215 that includes the target cell. As such, the BER that is appropriate for the logical page of the nonvolatile memory storage module 1215 may be taken into consideration when generating the neighboring cell contribution LLR look-up tables 1235.

Because the contribution from the neighboring cells is dependent upon the programmed state of the target cell, one or more neighboring cell contribution LLR look-up tables 1235 may include a first neighboring cell contribution look-up table associated with a programmed state of the target cell and a second neighboring cell contribution look-up table associated with an unprogrammed state of the target cell, wherein the first neighboring cell contribution look-up table 1235 is different than the second neighboring cell contribution look-up table 1235.

Figure 12:
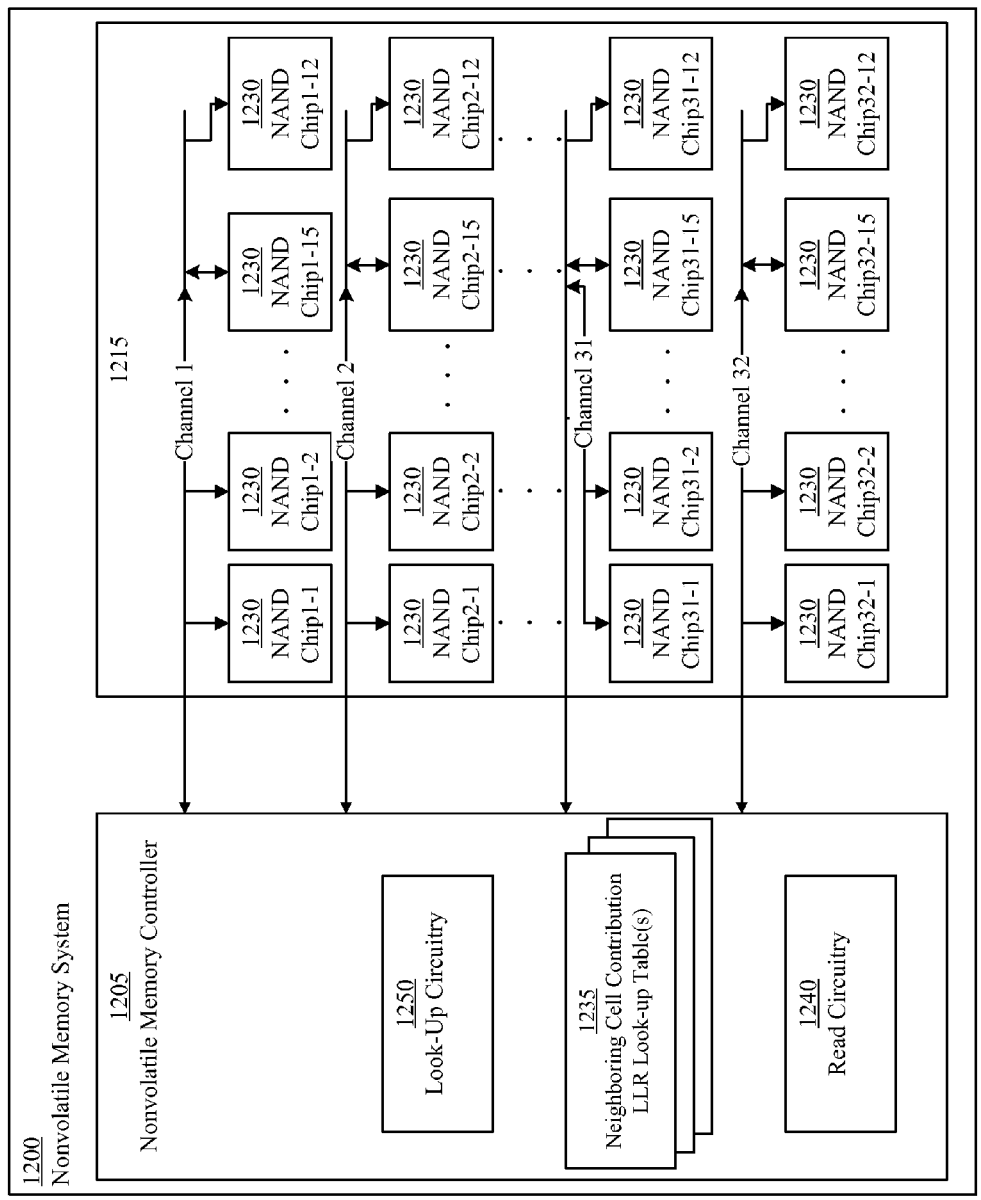
FIG. 12 is a block diagram illustrating a nonvolatile memory system in accordance with an embodiment of the present invention.
Figure 13:
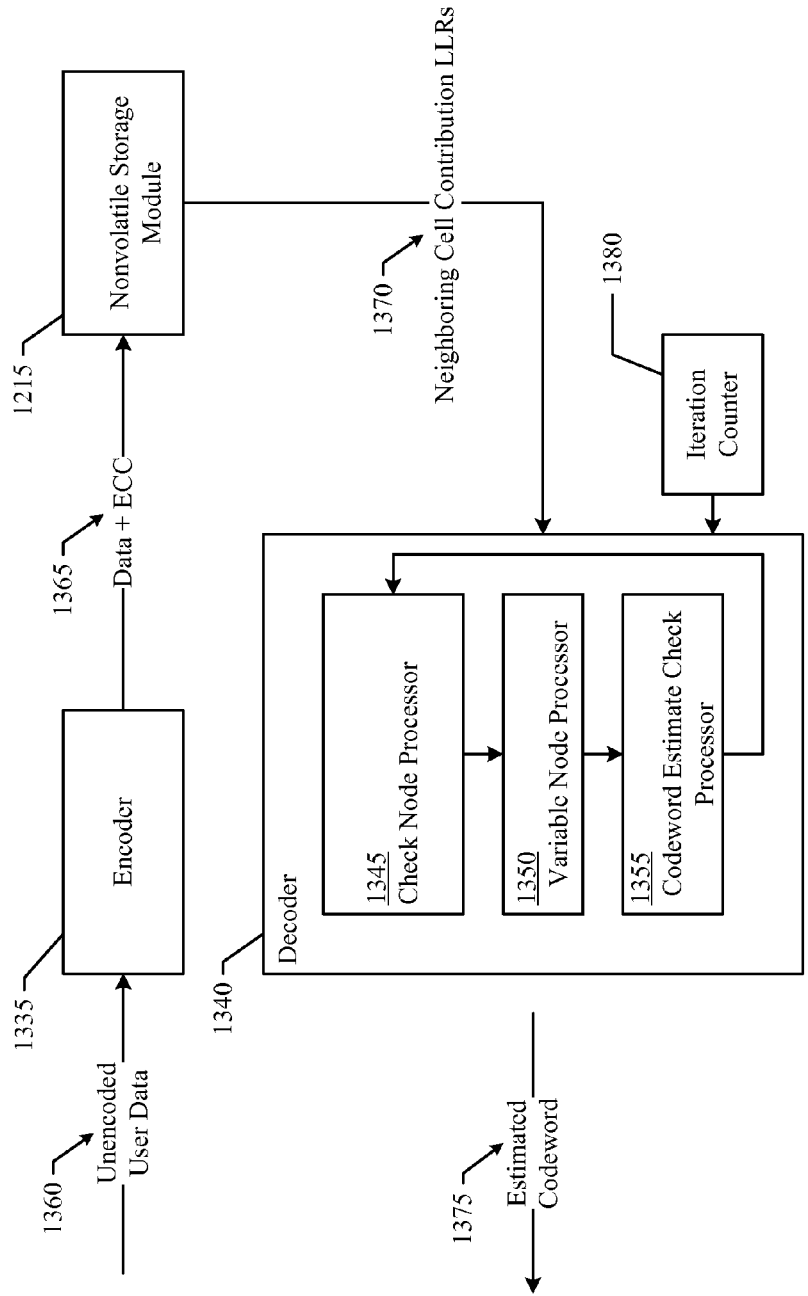
FIG. 13 is a block diagram illustrating LDPC encoding and LDPC decoding in accordance with an embodiment of the present invention.

The nonvolatile memory storage module 1215 of FIG. 12 may be incorporated into a LDPC system as shown with reference to FIG. 13. As shown, the LDPC system may comprise an encoder 1335 that is responsible for adding the parity bits to the unencoded user data 1360 in accordance with a low-density parity check (LDPC) code. The LDPC encoded data 1365, which includes the unencoded user data 1360 and an error correction code, may then be stored as encoded codewords in the nonvolatile memory storage module 1215. In a particular embodiment, the nonvolatile memory storage module 1215 may include a plurality of NAND chips 1230. The nonvolatile memory storage module 1215 and a nonvolatile memory controller 1205 having a plurality of neighboring cell contribution look-up tables 1235 may be integrated into a nonvolatile memory system 1200 as previously described with reference to FIG. 12.

In operation of the present invention, during a read operation of the nonvolatile memory storage module 1215, multiple reads of the stored codewords are executed to provide soft-decision information represented by the neighboring cell contribution LLRs 1370 extracted from an LLR look-up table 1235 that is specific to the neighboring cells of the device. The LLR look-up tables 1235 may also include the current point in the lifetime of the device, which may be identified by the BER of the device or by other means, such as by counting the P/E cycles of the device. The LLRs 1370 are used as input to the LDPC decoder 1340 to decode the unencoded user message data 1360 encoded by the encoder 1335, utilizing LDPC coding following a parity check matrix (H). The received LLR values for each variable node are taken as the initial variable node messages. The check node processor 1345 updates the check nodes of a first layer with the variable node messages to which they are connected. The resulting messages of the check node processor 1345 are then passed to the variable node processor 1350 and the variable node processor 1350 then updates each variable node with the check node messages to which they are connected. The iterative decoding process continues, as is known in the art, and the resulting codeword estimate is then checked by a codeword estimate check processor 1355, to verify whether or not the codeword estimate is a valid codeword. In a particular embodiment, the codeword estimate may be multiplied by the parity check matrix to determine the syndrome and if the syndrome is zero, it may be determined that the codeword estimate is a valid codeword. If the codeword estimate is determined to be a valid codeword, the decoding is complete and the estimated codeword is provided as output 1375 from the decoder 1340. If it is determined by the codeword estimate check processor 1355 that the codeword estimate is not a valid codeword, a second iteration of the decoding begins. The iteration counter 1380 may be used to track the number of iterations of the decoding process and may cause the decoding to terminate if a maximum number of iterations is reached.

In order to determine the LLRs it is necessary to know the states of the cells surrounding the target cell so that the pattern can be determined and the appropriate LLR can be extracted from the neighboring cell contribution LLR look-up table 1235. The nonvolatile memory storage module 1215 comprises a plurality of pages which may be organized in an interleaved architecture or, alternatively, in an all-bit-line (ABL) architecture.

Figure 14:
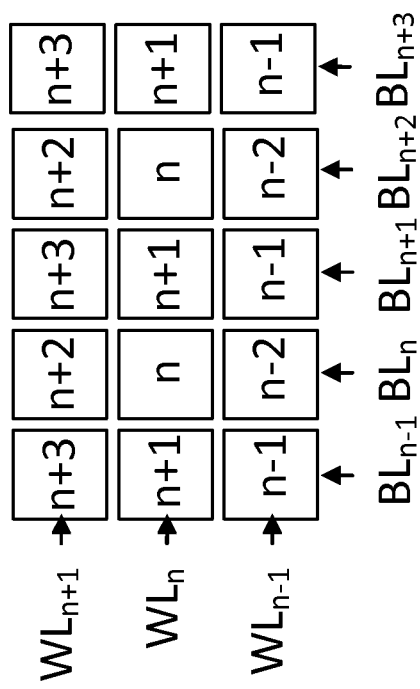
FIG. 14 is an illustration of the page organization for an interleaving architecture in a NAND device.

In an exemplary embodiment, in the case of an interleaving NAND memory architecture, two pages belong to the same word-line (WL). As shown with reference to FIG. 14, to measure the pattern of the surrounding cells of a target cell on page n, requires the reading of pages: n+3, n+2, n+1, n, n−1, n−2. In a random read case, these six pages need to be read in order to be able to correct page "n". An additional advantage can be realized when utilizing a sequential read access for the interleaved NAND memory architecture. While there is still a latency associated with the six pages read in a sequential read, the same six pages needed to correct page "n" can also be used to correct page "n+1". As such, in a sequential read access, a latency of six reads exists, but there is no associated overhead, i.e. 2 pages read in order to correct 2 pages, or 1 read/page.

Figure 15:
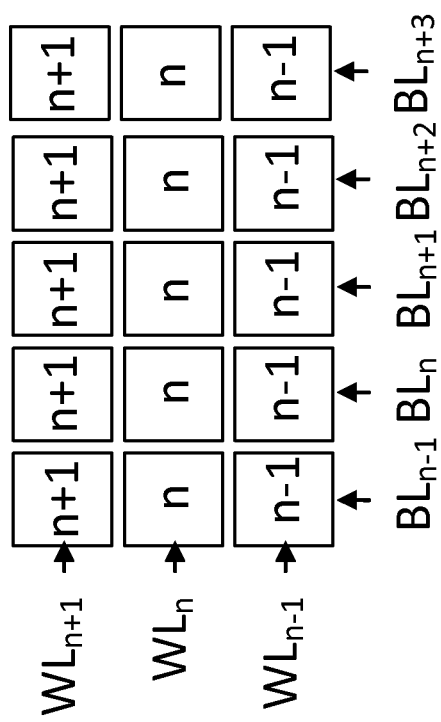
FIG. 15 is an illustration of the page organization for an all bit-line architecture in a NAND device.

In an additional embodiment, as shown with reference to FIG. 15, in the case of an all bit-line architecture, to measure the pattern of the surrounding cells of a target cell on page n, requires the reading of pages: n−1, n, n+1. In a random read case, these three pages must be read in order to be able to correct page "n". An additional advantage can be realized when utilizing a sequential read access. While there is still a latency associated with the three pages read in a sequential read, once page "n" in corrected, it is only necessary to read page "n+2" in order to be able to correct page "n+1". As such, in all bit-line sequential read access, a latency of 3 reads exists, but there is no associated overhead: 1 page read in order to correct 1 page, or 1 read/page The plurality of LLR look-up tables reflecting the effects of the neighboring cells are stored in the flash memory controller and in operation, the flash memory controller selects the appropriate LLR look-up table to use for decoding the codeword.

In the present invention, an LLR look-up table need not be a physical entity, but may be considered in a broader sense to be a logical entity. Additionally, the various LLR look-up tables reflecting the current BER of the device may be independent look-up tables or may alternatively be subsets of a larger look-up table.

The present invention utilizes a pattern recognition circuit to identify a pattern of the state of some or all of the neighboring cells in addition to the value of a target cell. The interpretation of the pattern by the pattern recognition circuit takes into account the proximity of the neighboring cells to the target cell, electrical coupling strengths, etc. The pattern recognition circuit translates the pattern into an LLR value for storage into an LLR table. Many different patterns may translate to the same LLR value. A particular pattern for one vendor's flash technology may translate into a different LLR on another vendor's flash technology because the same pattern may be representing a different physical layout of the cells. Furthermore, the LLR a certain pattern translates to may change over time as a result of the program/erase cycles. For example, pattern A may translate to LLR "x" at the beginning of the life of the flash device, but after 8,000 erase cycles, pattern A may now translate to LLR "y". The LLRs stored in the look-up tables may reflect both the contribution of the neighboring cells to a cell being read and the change of the contribution over the device lifetime.

Additionally, it is not necessary to consider all of the neighboring cells in the LLRs. For example, the diagonal neighbors may have a weaker electrical coupling with the center cell and may be omitted. While the final LLR value for the center cell may not be quite as accurate as it could be when considering all the neighboring cells, omitting the diagonal neighbors may save additional flash read and processing time. The tradeoff in increased performance by omitting some of the neighboring cells may be preferred in a particular application.

Figure 16:
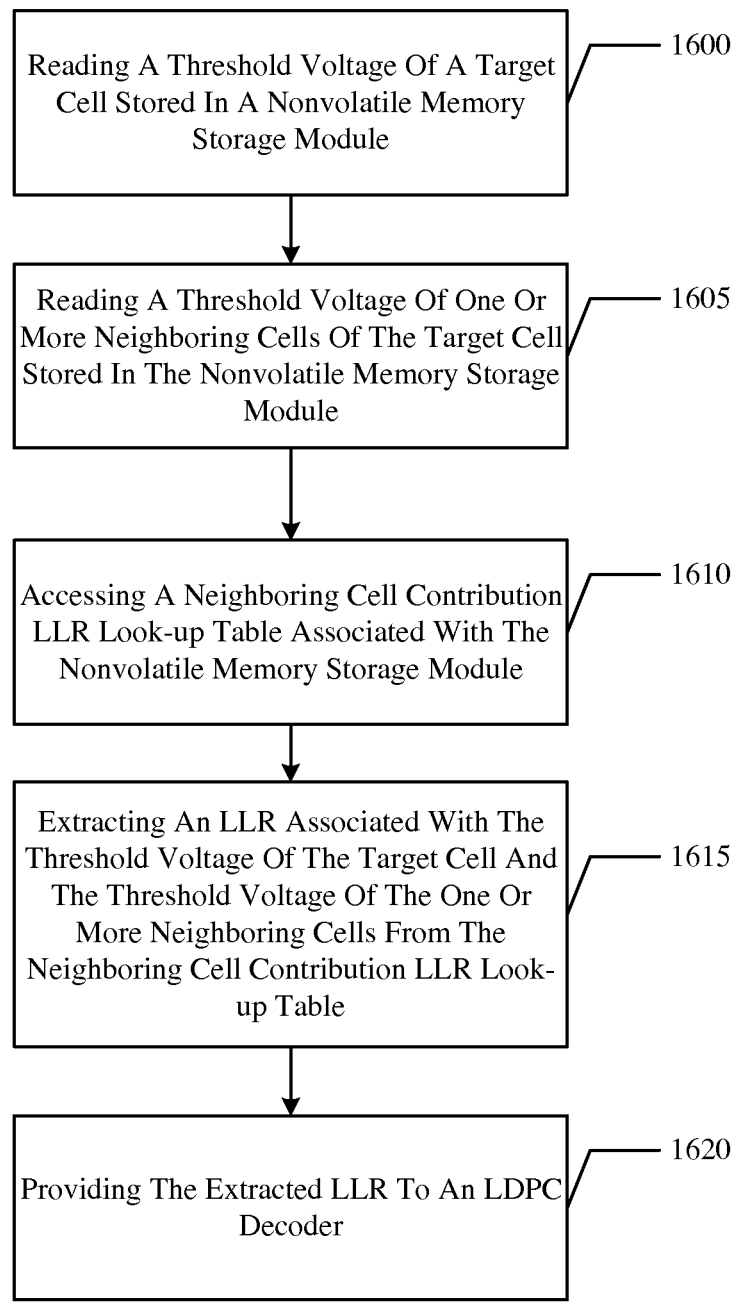
FIG. 16 is a flow diagram illustrating a method of providing LLRs to an LDPC decoder in accordance with an embodiment of the present invention.

With reference to FIG. 16, a method of providing one or more log likelihood ratio (LLRs) of a target cell to a low-density parity check (LDPC) decoder is described. The method begins by reading a threshold voltage of a target cell stored in a nonvolatile memory storage module 1600. In one embodiment, the threshold voltage of the target cell may be read from a nonvolatile memory storage module 1215 using the read circuitry 1240 of the nonvolatile memory controller 1205. The nonvolatile memory storage module 1215 may include a plurality of pages organized in an interleaved architecture or in an all-bit-line (ABL) architecture. In reading a threshold voltage of a target cell stored in a nonvolatile memory storage module 1600, the method may further include, reading the threshold voltages of a logical page of cells of the nonvolatile memory storage module, wherein the logical page of cells includes the target cell. Reading a threshold voltage of a target cell stored in a nonvolatile memory storage module 1600 may further include, using a plurality of soft-decision reference voltages to read a plurality of threshold voltages of the target cell.

After reading a threshold voltage of a target cell stored in a nonvolatile memory storage module 1600, the method further includes, reading a threshold voltage of one or more neighboring cells of the target cell stored in the nonvolatile memory storage module 1605. In one embodiment, the threshold voltage of the one or more neighboring cells may be read from a nonvolatile memory storage module 1215 using the read circuitry 1240 of the nonvolatile memory controller 1205. Reading a threshold voltage of one or more neighboring cells of the target cell stored in the nonvolatile memory storage module 1605 may further include, reading the threshold voltages of one or more logical pages of cells of the nonvolatile memory storage module, each of the one or more logical pages including one of the neighboring cells. Additionally, reading a threshold voltage of one or more neighboring cells of the target cell stored in a nonvolatile memory storage module 1605 may further include, using a plurality of soft-decision reference voltages to read a plurality of threshold voltages of each of the one or more neighboring cells.

After the threshold voltage of the target cell and the threshold voltage of the one or more neighboring cells of the target cell have been read, the method further includes, accessing a neighboring cell contribution LLR look-up table associated with the nonvolatile memory storage module 1610. In one embodiment the neighboring cell contribution LLR look-up table 1235 may be stored in a nonvolatile memory controller 1205. Accessing a neighboring cell contribution LLR look-up table associated with the nonvolatile memory storage module 1610 may further include, accessing a neighboring cell contribution LLR look-up table associated with a current point in the lifetime of the nonvolatile memory storage module. Additionally, accessing a neighboring cell contribution LLR look-up table associated with the nonvolatile memory storage module 1610 may further include, accessing a neighboring cell contribution LLR look-up table associated with a logical page of the nonvolatile memory storage module that includes the target cell. In an additional embodiment, accessing a neighboring cell contribution LLR look-up table associated with the nonvolatile memory storage module 1610 may further include, accessing a first neighboring cell contribution look-up table when the threshold voltage of the target cell indicates a programmed state of the target cell and accessing a second neighboring cell contribution look-up table when the threshold voltage of the target cell indicates an unprogrammed state of the target cell, wherein the first neighboring cell contribution look-up table is different than the second neighboring cell contribution look-up table.

Upon accessing the neighboring cell contribution LLR look-up table associated with the nonvolatile memory storage module 1610, the method further includes extracting an LLR associated with the threshold voltage of the target cell and the threshold voltage of the one or more neighboring cells from the neighboring cell contribution LLR look-up table 1615.

After the appropriate LLR has been extracted from the neighboring cell contribution LLR look-up table 1615, the extracted LLR is provided to an LDPC decoder 1620.

The present invention utilizes the knowledge of now the NAND cells are physically laid out and their program/erase and read cycles to predict the most likely correct state of a cell whose correct state has been corrupted with noise. With the information regarding the programmed states of the neighboring cells, the physical proximity of the neighboring cells and the number of read and program/erase cycles that have been performed on a cell being read, it can be determined how the current state of a neighboring cell influences the state of the cell. If these factors have a very small effect, the LLR value assigned to the cell being read would be a large magnitude. If these factors have a larger effect, the assigned LLR value would have a smaller magnitude, thereby indicating a decreased likelihood that the correct state of the cell is the value that was read. So, by reading the state of some or all of the neighboring cells, in addition to reading the desired cell, a high quality LLR can be assigned to the cell being read, thereby improving the decode performance resulting in a faster convergence or enabling a previously unavailable solution. The higher quality LLR values of the present invention increase the likelihood of determining a correct codeword during the decode process.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method of providing one or more log likelihood ratio (LLRs) of a target cell to a low-density parity check (LDPC) decoder, the method comprising:
storing a neighboring cell contribution LLR look-up table associated with the nonvolatile memory storage module, the neighboring cell contribution LLR look-up table including combinations of possible read patterns for the target cell and the neighboring cells, and associated LLR's, each of the LLR's corresponding to a bit error rate for the associated possible read pattern;
reading a threshold voltage of a target cell stored in a nonvolatile memory storage module;
reading a threshold voltage of one or more neighboring cells of the target cell stored in the nonvolatile memory storage module;
accessing the neighboring cell contribution LLR look-up table associated with the nonvolatile memory storage module;
extracting from the neighboring cell contribution LLR look-up table the LLR corresponding to the pattern of the read of the threshold voltage of the target cell and the read of the threshold voltage of the one or more neighboring cells; and
providing the extracted LLR to an LDPC decoder.

2. The method of claim 1, wherein reading a threshold voltage of a target cell stored in a nonvolatile memory storage module further comprises, reading the threshold voltages of a logical page of cells of the nonvolatile memory storage module, the logical page of cells including the target cell.

3. The method of claim 1, wherein reading a threshold voltage of one or more neighboring cells of the target cell stored in the nonvolatile memory storage module further comprises, reading the threshold voltages of one or more logical pages of cells of the nonvolatile memory storage module, each of the one or more logical pages including one of the neighboring cells.

4. The method of claim 1, wherein reading a threshold voltage of a target cell stored in a nonvolatile memory storage module further comprises, using a plurality of soft-decision reference voltages to read a plurality of threshold voltages of the target cell.

5. The method of claim 1, wherein reading a threshold voltage of one or more neighboring cells of the target cell stored in a nonvolatile memory storage module further comprises, using a plurality of soft-decision reference voltages to read a plurality of threshold voltages of each of the one or more neighboring cells.

6. The method of claim 1, wherein accessing the neighboring cell contribution LLR look-up table associated with the nonvolatile memory storage module further comprises accessing a neighboring cell contribution LLR look-up table associated with a current point in the lifetime of the nonvolatile memory storage module.

7. The method of claim 1, wherein accessing the neighboring cell contribution LLR look-up table associated with the nonvolatile memory storage module further comprises accessing a neighboring cell contribution LLR look-up table associated with a logical page of the nonvolatile memory storage module that includes the target cell.

8. The method of claim 1, wherein the nonvolatile memory storage module comprises a plurality of pages organized in an interleaved architecture or in an all-bit-line (ABL) architecture.

9. A method of providing one or more log likelihood ratio (LLRs) of a target cell to a low-density parity check (LDPC) decoder, the method comprising:
reading a threshold voltage of a target cell stored in a nonvolatile memory storage module;
reading a threshold voltage of one or more neighboring cells of the target cell stored in the nonvolatile memory storage module;
accessing a neighboring cell contribution LLR look-up table associated with the nonvolatile memory storage module, the accessing a neighboring cell contribution LLR look-up table associated with the nonvolatile memory storage module further comprising accessing a first neighboring cell contribution look-up table when the threshold voltage of the target cell indicates a programmed state of the target cell and accessing a second neighboring cell contribution look-up table when the threshold voltage of the target cell indicates an unprogrammed state of the target cell, wherein the first neighboring cell contribution look-up table is different than the second neighboring cell contribution look-up table;
extracting an LLR associated with the threshold voltage of the target cell and the threshold voltage of the one or more neighboring cells from the first neighboring cell contribution LLR look-up table or the second neighboring cell contribution LLR look-up table; and
providing the extracted LLR to an LDPC decoder.

10. A nonvolatile memory controller for providing one or more log likelihood ratios (LLRs) of a target cell for LDPC decoding, the controller comprising:
read circuitry configured for reading a threshold voltage of a target cell stored in a nonvolatile memory storage module and for reading a threshold voltage of one or more neighboring cells of the target cell stored in the nonvolatile memory storage module;
one or more neighboring cell contribution LLR look-up tables associated with the nonvolatile memory storage module, the one or more neighboring cell contribution LLR look-up tables including combinations of possible read patterns for the target cell and the neighboring cells, and associated LLR's, each of the LLR's corresponding to a bit error rate for the associated possible read pattern; and
look-up circuitry configured for extracting an LLR associated with the threshold voltage of the target cell and the threshold voltage of the one or more neighboring cells from the one or more neighboring cell contribution LLR look-up tables and for providing the extracted LLR to an LDPC decoder.

11. The controller of claim 10, wherein the read circuitry is further configured for reading a logical page of the nonvolatile memory storage module, the logical page including the target cell.

12. The controller of claim 10, wherein the read circuitry is further configured for reading one or more neighboring logical pages of the nonvolatile memory storage, each of the one or more neighboring logical pages including one of the neighboring cells of the target cell.

13. The controller of claim 10, wherein the read circuitry is further configured for using a plurality of soft-decision reference voltages to read a plurality of threshold voltages of the target cell.

14. The controller of claim 10, wherein the read circuitry is further configured for using a plurality of soft-decision reference voltages to read a plurality of threshold voltages of each of the one or more neighboring cells.

15. The controller of claim 10, wherein the one or more neighboring cell contribution LLR look-up tables includes a neighboring cell contribution LLR look-up table that is associated with a current point in the lifetime of the nonvolatile memory storage module.

16. The controller of claim 10, the one or more neighboring cell contribution LLR look-up tables includes a neighboring cell contribution LLR look-up table that is associated with a logical page of the nonvolatile memory storage module that includes the target cell.

17. The controller of claim 10, wherein the nonvolatile memory storage module comprises a plurality of pages organized in an interleaved architecture or in an all-bit-line (ABL) architecture.

18. A nonvolatile memory controller for providing one or more log likelihood ratios (LLRs) of a target cell for LDPC decoding, the controller comprising:
    read circuitry configured for reading a threshold voltage of a target cell stored in a nonvolatile memory storage module, and for reading a threshold voltage of one or more neighboring cells of the target cell stored in the nonvolatile memory storage module;
    one or more neighboring cell contribution LLR look-up tables associated with the nonvolatile memory storage module, including a first neighboring cell contribution look-up table associated with a programmed state of the target cell and a second neighboring cell contribution look-up table associated with an unprogrammed state of the target cell, wherein the first neighboring cell contribution look-up table is different than the second neighboring cell contribution look-up table; and
    look-up circuitry configured for extracting an LLR associated with the threshold voltage of the target cell and the threshold voltage of the one or more neighboring cells from the one or more neighboring cell contribution LLR look-up tables and for providing the extracted LLR to an LDPC decoder.

* * * * *